(12) United States Patent
Daidzic

(10) Patent No.: US 9,810,207 B2
(45) Date of Patent: Nov. 7, 2017

(54) METHOD AND SHEAR-DRIVEN MICRO-FLUIDIC PUMP

(71) Applicant: AAR Aerospace Consulting, LLC, St. Peter, MN (US)

(72) Inventor: Nihad E. Daidzic, St. Peter, MN (US)

(73) Assignee: AAR Aerospace Consulting, LLC, St. Peter, MN (US)

( * ) Notice: Subject to any disclaimer, the term of this patent is extended or adjusted under 35 U.S.C. 154(b) by 0 days.

(21) Appl. No.: 15/387,567

(22) Filed: Dec. 21, 2016

(65) Prior Publication Data

US 2017/0096990 A1    Apr. 6, 2017

Related U.S. Application Data

(62) Division of application No. 13/947,993, filed on Jul. 22, 2013, now Pat. No. 9,528,503.

(Continued)

(30) Foreign Application Priority Data

Feb. 27, 2013   (IT) .............................. TO2013A0161

(51) Int. Cl.
F04B 19/00    (2006.01)
F04B 43/04    (2006.01)
(Continued)

(52) U.S. Cl.
CPC ............ *F04B 19/006* (2013.01); *B23P 15/26* (2013.01); *F04B 17/04* (2013.01); *F04B 35/045* (2013.01);
(Continued)

(58) Field of Classification Search
CPC ........ F04B 19/006; F04B 17/04; F04B 53/08; F04B 35/045; F04B 43/043;
(Continued)

(56) References Cited

U.S. PATENT DOCUMENTS 3,960,057 A    6/1976  Kometani
4,210,409 A    7/1980  Child
(Continued)

FOREIGN PATENT DOCUMENTS

EP    1362827 A1    11/2003
EP    2772648 A2    9/2014
(Continued)

*Primary Examiner* — Devon Kramer
*Assistant Examiner* — Thomas Cash
(74) *Attorney, Agent, or Firm* — Charles A. Lemaire; Jonathan M. Rixen; Lemaire Patent Law Firm, P.L.L.C.

(57) ABSTRACT

An example includes an apparatus to pump a fluid. The apparatus includes a housing extending along a length defining an elongate interior, an actuator in the housing, conforming to the elongate interior, the actuator including a plurality of lumens, each having a length extending substantially parallel to the elongate interior, each from around 10 to 200 micrometers across and an actuator configured to oscillate the actuator in the actuator housing along the length of the elongate interior with a rate differential between movement in a first direction versus movement in a second direction opposite the first direction to pump the fluid.

21 Claims, 17 Drawing Sheets

Related U.S. Application Data

(60) Provisional application No. 61/770,250, filed on Feb. 27, 2013.

(51) Int. Cl.
  *F04B 35/04* (2006.01)
  *B23P 15/26* (2006.01)
  *G06F 1/20* (2006.01)
  *H05K 7/20* (2006.01)
  *F04B 17/04* (2006.01)
  *F04B 53/08* (2006.01)

(52) U.S. Cl.
  CPC ............ *F04B 43/043* (2013.01); *F04B 53/08* (2013.01); *G06F 1/20* (2013.01); *H05K 7/20172* (2013.01); *H05K 7/20263* (2013.01); *H05K 7/20272* (2013.01); *Y10T 29/4935* (2015.01)

(58) Field of Classification Search
  CPC .......... H05K 7/20263; H05K 7/20272; H05K 7/20172; G06F 1/20; B23P 15/26; Y10T 29/4935
  See application file for complete search history.

(56) References Cited

U.S. PATENT DOCUMENTS

| | | | |
|---|---|---|---|
| 4,348,946 A | | 9/1982 | Eickmann |
| 4,447,195 A | * | 5/1984 | Schuck ............... F01B 9/02 417/570 |
| 5,509,792 A | | 4/1996 | Sullivan et al. |
| 5,833,440 A | * | 11/1998 | Berling ............... F04B 49/06 310/23 |
| 7,299,770 B2 | | 11/2007 | Thorpe |
| 2013/0142672 A1 | * | 6/2013 | Blackson ............ F04B 9/113 417/53 |
| 2015/0139819 A1 | * | 5/2015 | Bagagli ............ F04B 35/045 417/53 |
| 2016/0228977 A1 | | 8/2016 | Shibata |

FOREIGN PATENT DOCUMENTS

| | | |
|---|---|---|
| SU | 1208286 A1 | 1/1986 |
| WO | WO 2005060593 A2 | 7/2005 |
| WO | WO 2007091197 A1 | 8/2007 |

\* cited by examiner

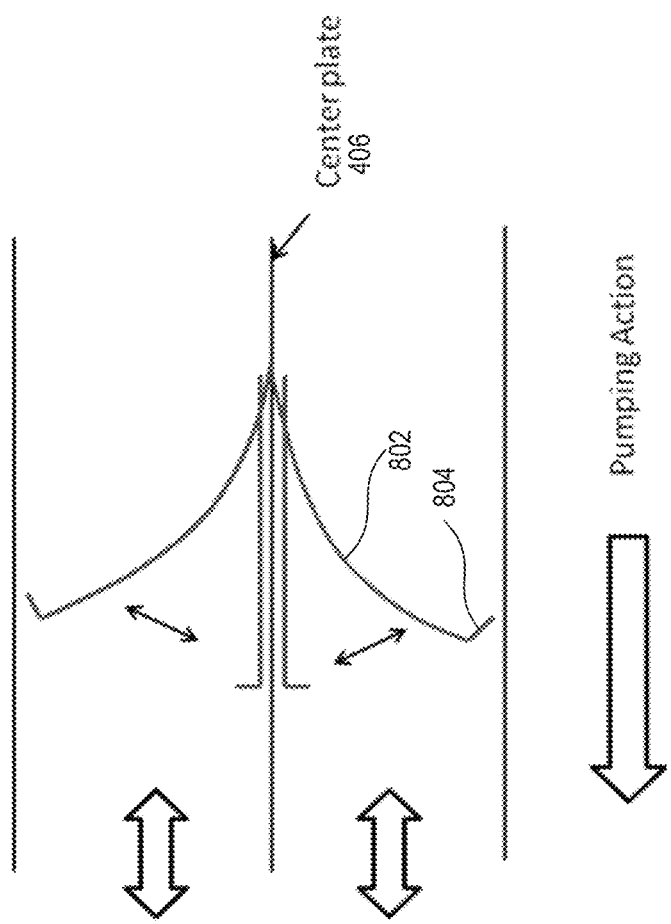

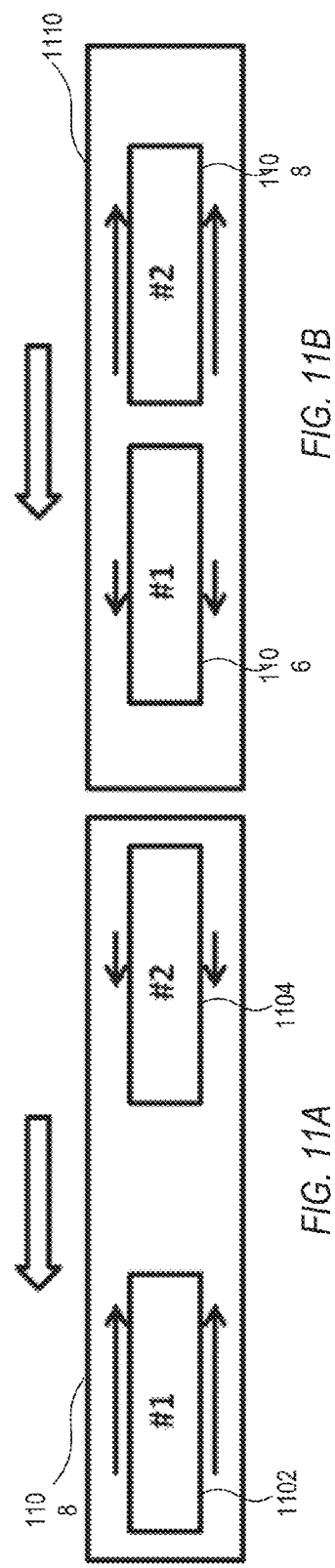
FIG. 11A
FIG. 11B
FIG. 11C

METHOD AND SHEAR-DRIVEN MICRO-FLUIDIC PUMP

CROSS-REFERENCE TO RELATED APPLICATIONS

This application is a divisional of U.S. patent application Ser. No. 13/947,993, filed Jul. 22, 2013 by Nihad Daidzic and titled "Shear driven micro-fluidic pump" (which issued as U.S. Pat. No. 9,528,503 on Dec. 27, 2016), which claims the benefit of priority under 35 U.S.C. §119(e) to U.S. Provisional Application No. 61/770,250, filed Feb. 27, 2013 and titled "Shear driven micro-fluidic pump," and claims the benefit of priority under 35 U.S.C. §119(a)-(d) to Italian Application No. TO2013A000161, filed Feb. 27, 2013 and titled "Shear driven micro-fluidic pump" (which issued as Italian Patent No. 1417117 on Jul. 24, 2015), each of which is incorporated herein by reference in its entirety.

BACKGROUND

Heat exchange is an important design consideration. Heat exchangers such as heat sinks or heat emitters can benefit many systems by transferring heat away from, or to, a heat source. There are a number of attributes to consider when designing a heat-exchange system to cool another system. Size, mass, cost, performance and reliability each are important factors. In order to address some or all of these factors, systems can be designed in which a cooling fluid is circulated nearby a heat source to cool the heat source. Such systems can include pumps to circulate fluid. Small, low-cost designs are desirable.

Existing micro-fluidic pumps are small, but they can be unreliable, expensive, and can have many moving components, including sensitive microvalves prone to breaking. They can be quite inefficient with large transducer power consumption and large leakage flows. Many require strong electrostatic forces or other forces that cannot be efficiently generated at small scales. Mechanical micropumps can be used but they can be affected with some of aforementioned problems.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

FIG. 8 is a schematic showing valve function, according to an example.

FIG. 11A illustrates a first mode of operation of a two actuator pumping system, according to an example.

FIG. 11B illustrates a second mode of operation of a two actuator pumping system, according to an example.

FIG. 11C illustrates two actuators aligned in series to pump fluid, according to an example.

DETAILED DESCRIPTION

Present disclosure relates to shear-driven micro-fluidic pumps ("SDMFP"). The shear-driven microfluidic pump oscillates an actuator (e.g., a piston with small lumens disposed therethrough) to produce high-pressures and high fluid flow rates of a fluid (e.g., liquid or gas or a combination thereof) based on non-harmonic actuator motion imparting a speed differential between forward stroke and return stroke. Motion can be imparted onto the pump by a micro-solenoid or a piezo-transducer. In some examples, the pump includes valves such as microvalves to augment performance.

There are many advantages exhibited by the present subject matter. The shear-driven micro-fluidic pump SDMFP examples disclosed herein can employ pumping of fluids on millimeters and sub-millimeter (micrometer) scales and can be more cost effective, robust, and reliable than existing micro-fluidic (MEMS) pumping systems.

Beneficial aspects include one or more of: improved total micro-pump efficiency (10-50%); improved ease of manufacturing; reduced cost of manufacturing; and improved flexibility to manufacture SDMFP in various sizes from about 50 micrometer to 10 millimeter for various MEMS technical and biomedical/medical applications. The simplicity of the pump and the inherent fail-safe design with fewer elements can be especially helpful in biomedical and medical applications.

A working principle behind a SDMFP can be the viscous diffusion of vorticity. Such vorticity can be created at the moving wall in order to satisfy the no-slip condition. Vorticity can be diffused into the fluid through the mesoscopic phenomenological momentum transport coefficient, i.e., viscosity. This phenomenon can be similar to the phenomenon of how heat can be diffused using the thermal diffusivity as transport coefficient. As an analogous example, one can visualize oscillating walls (boundaries) creating dissipative transverse pseudo shear-waves. Such shear-waves can propagate perpendicular to fluid motion and cannot reflect from the boundaries as they do not have ability to store and release potential energy.

Figure 1:
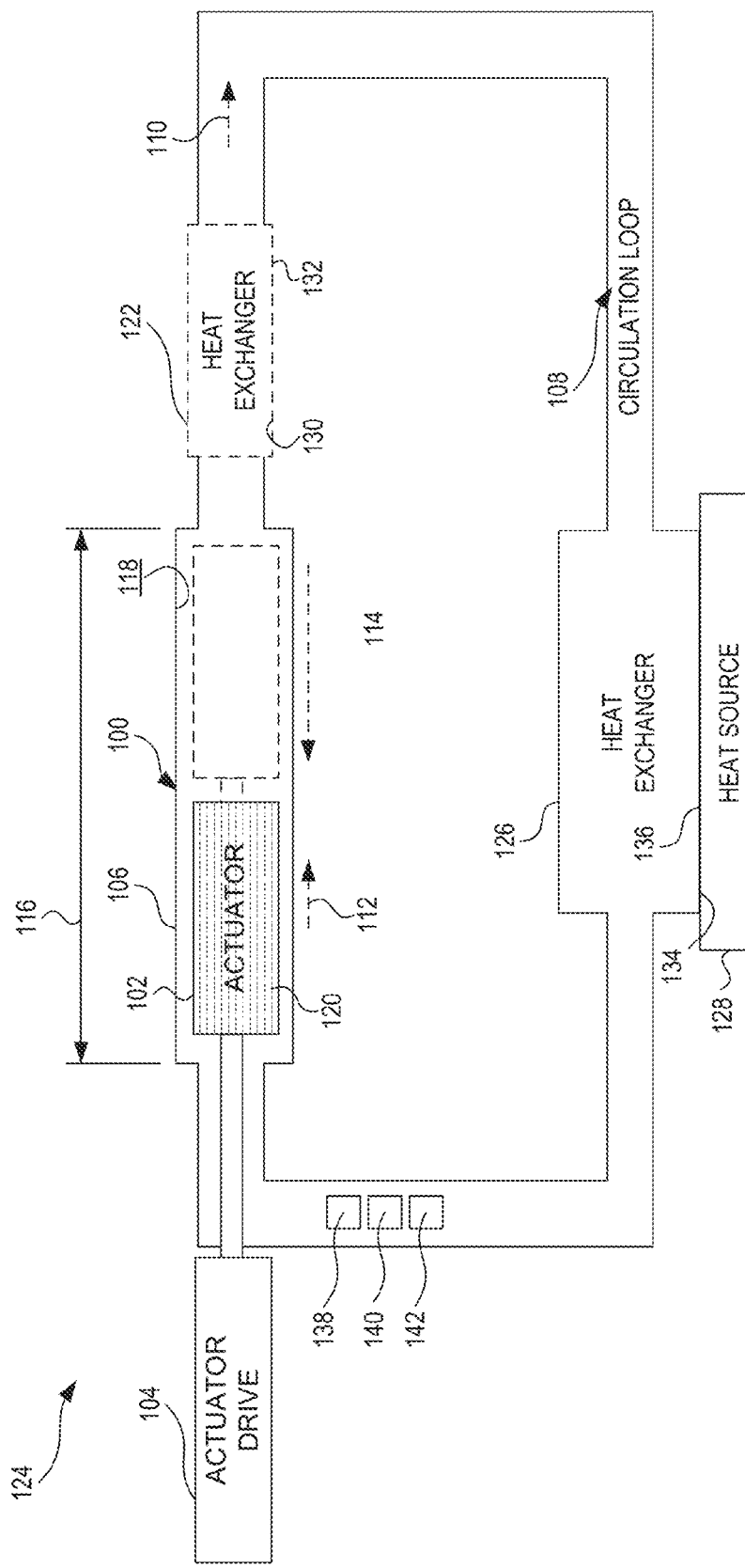
FIG. 1 illustrates a system for pumping a fluid, according to an example.

FIG. 1 illustrates a system for pumping a fluid, according to an example. The SDMFP 100 consists of one or more actuators 102, an actuator drive 104 (micro-solenoid, piezo-transducer, linear DC micro-motor, etc.) and a housing 106. The actuator drive 104 can include a micro-solenoid. A piezo-transducer can deliver high pressures and forces but the stroke can be short. A force/displacement converter can be used (e.g., a lever) to deliver required action over the entire stroke length.

The housing 106 can extend along a length 116 defining an elongate interior 118. The actuator 102 can be disposed in the housing 106, conforming to the elongate interior 118. The pump 100 can be from around 30 millimeters in length, 15 millimeters in width and 15 millimeters in height. These dimensions can apply to the exterior of the housing 106.

A circulation loop 108 can include various conduits, manifolds and the like. The pumped flow 110 can be caused by the actuator 120 oscillating in housing 106. The oscillation can occur at a rate differential between movement in a first or forward direction or stroke 112 versus movement in a second or return direction or stroke 114 opposite the first stroke 112.

The actuator 102 can include a plurality of lumens 120. Each of the lumens 120 can have a length extending substantially parallel to the elongate interior 118, such as to a surface or axis thereof. Each of the lumens 120 can measure from around 10 to 200 micrometers across. Examples lumens can include microtubes or micro-channels disposed in the actuator 102. At least one of the plurality of lumens has a rectilinear shape in cross-section. At least one of the plurality of lumens has a circular shape in cross-section. The plurality of lumens can be distributed according to a regular pattern. The plurality of lumens can be distributed according to a random pattern, as illustrated. The plurality of lumens comprise from around 60% to 80% of a cross-sectional area of the actuator. The plurality of lumens comprise from around 78.5% of a cross-sectional area of the actuator.

As the actuator moves according to a forward stroke 112, fluid such as fluid can be pulled through the lumens and thus through the housing 106. The return stroke 114 can be faster than the forward stroke 112. In an example, the return stroke is from 100 to 1000 times faster. Accordingly, movement in the return direction can be at a frequency that can be from around 100 to around 1000 times faster than movement in the forward direction. Movement in the return direction can be around 1000 hertz, and movement in the forward direction can be at around 10 hertz. The movement in the return direction can be around 10000 hertz, and movement in the forward direction can be at around 10 hertz. The movement in the return direction can be around 2000-5000 hertz, and movement in the forward direction can be at from around 20-50 hertz. Simple harmonic period motion can windmill the fluid.

The movement in the forward direction can be a forward distance from 0.5 to 5 millimeters in 100 to 500 milliseconds, and movement in the return direction can be a return distance 0.5 to 5 millimeters in 1 to 2 milliseconds. The forward distance and the return distance can be substantially equivalent. The actuator can be configured to move in the forward direction at an average speed of around 30-50 millimeters per second.

The average and/or instantaneous speeds in forward and return stroke of the wall can vary. These can depend on specific conditions desired in an application. The fluid can have an "effective" speed that is the complex interaction of the wall/interface/boundary speeds, vorticity diffusion, shear stresses, geometry, etc. The SDMFP pump can, in a period, e.g., 1 second, move fluid forward 10 mm and then pulls it back 3 mm in a return stroke. Accordingly, "effective" speed of the fluid can be 10−3=7 mm/s. For example, the average wall velocities can be 10 mm/s in a forward stroke and 1000 mm/s (1 m/s) in a return stroke. Different designs will have various "effective" fluid speeds ranging from about 5 to 50 mm/s. The wall speeds in forward and return stroke can vary from about 5 to 5000 mm/s.

The forward motion 112 can be caused by, for example, applying a 5V current to a micro-solenoid current at several mA. Other voltages can be used. The current can travel through the coil and force the actuator 102 forward, such as in response to magnetic fields interactions. Reverse motion can be achieved by high reverse-current in micro-solenoid. Reverse motion can be achieved by adverse fluid pressure action.

Very fast return motion can create partial or full slip on the boundary. This can be caused by simultaneous actuator impulse heating of the thin inner wall layers, which can involve hyperbolic heat transfer. The Stokes penetration layer can be shorter than in a forward stroke and pump leakage can be minimized.

The size of the lumens is important. The diffusive momentum transfer can decay exponentially from the generating wall. Therefore the range of friction forces can be quite short. This is at least partially why such pumping concept do not work (or can be inefficient) on macro scales such as in tubes, larger than 1 millimeter. Additionally, micro-tubes with less than 1-5 micrometers can have partial slip associated with them (molecular effects in general) and can be more difficult and expensive to manufacture.

Molecular dynamic (MD) or Monte-Carlo (MC) simulations and the use of Lattice-Boltzmann (LBM) computations can be used to find the lower range of operation. Very high pressures (in excess of several bars) can be achieved with very small micro-tubes. Accordingly, the lumens 120 can be 10 to 200 micrometers in diameter.

The SDMFP can for a part of a system 124. The system can include a heat exchanger 122. The heat exchanger 122 can include an emission portion, such as fins. An internal portion of the heat exchanger 122 can be in fluid communication with the circulation loop 108. An external portion 132 of heat emission portion 122, thermally conductive with the internal portion 130, can be configured to exchange heat with a cold source, such as an airflow, for example created by a fan.

The system 124 can include at least one heat exchanger 126 to exchange heat with an external object 128. For example, the heat exchanger 126 can include an internal portion 136 in fluid communication with the circulation loop 108 or forming a part thereof, and configured to exchange heat via an external portion 134 in communication with a heat source 128, such as an integrated circuit. The integrated circuit forms a part of a computer comprising a random-access memory. The integrated circuit forms a part of a computer comprising an embedded processor. A thermally conductive material such as grease can form part of the interface between the heat exchanger 126 and the heat source 128. The present subject matter extends to embodiments in which heat is exchanged from and to the external object 128. Embodiments in which heat transfer to the heat source is endothermic for the heat source can add heat to the heat exchanger 122.

A flow-rate sensor 138 can sense a flow rate of the flow 110. The pump 100 can be configured to adjust the oscillation in association with the flow rate. A temperature sensor 140 can sense a temperature. The pump 100 can be configured to adjust the oscillation in association with the temperature. A differential-pressure sensor 142 can sense a differential pressure. The pump 100 can be configured to adjust the oscillation in association with the differential pressure.

Figures 2A, 2B:
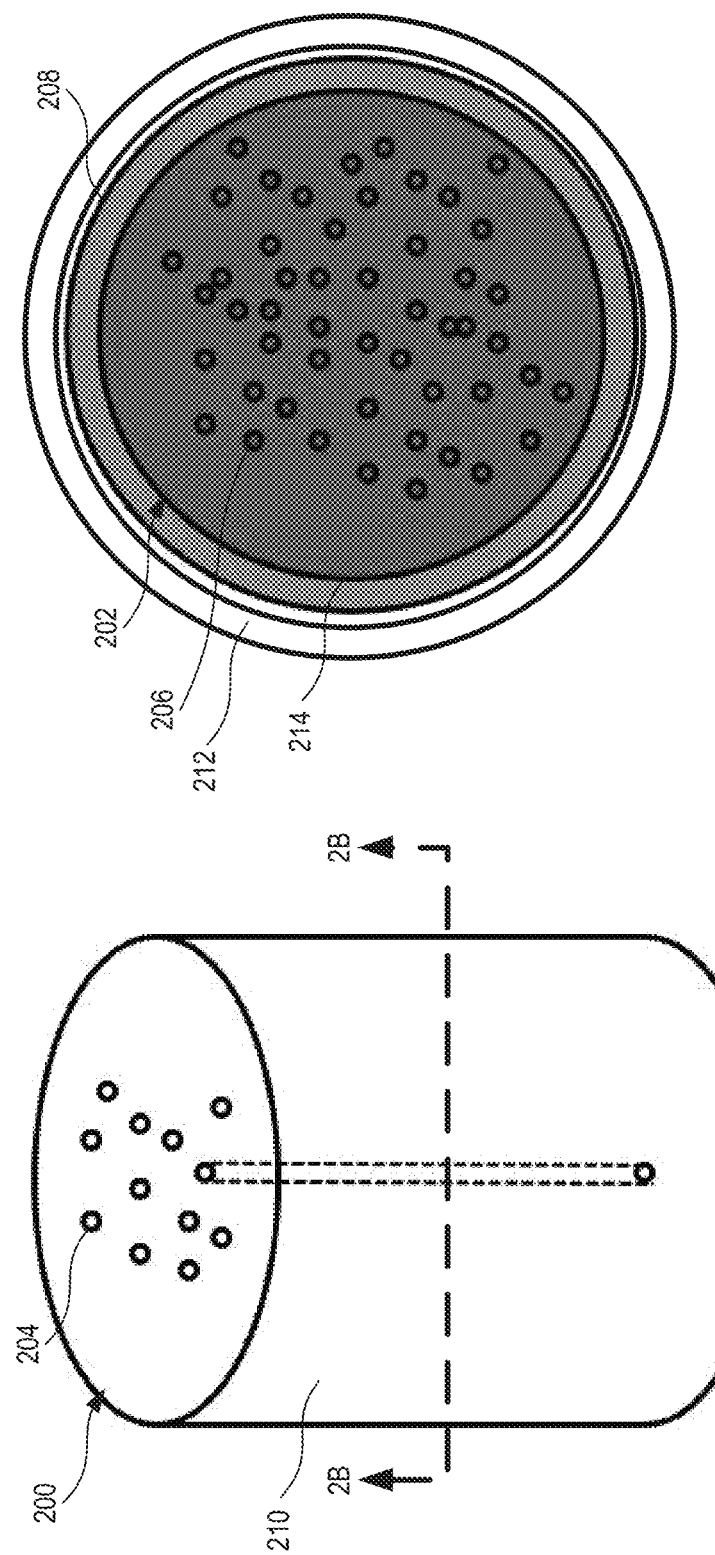
FIG. 2A illustrates an elevated perspective view of an actuator of a pump, according to an example.
FIG. 2B is the cross-sectional view of an actuator, according to an example.

FIG. 2A illustrates an elevated perspective view of an actuator 200 of a pump, according to an example. FIG. 2B is a cross-sectional view of an actuator 202, according to an example. FIG. 2B also illustrates a housing 208, that can house the actuator 202. The actuator 200 comprises a shear-driven micro-fluidic pump, cylindrical ("SDMFPC"), in which the actuator 200 has a cylindrical shape. The lumens illustrated represent an arbitrary sample of what can be hundreds of lumens, and thus examples are not limited to the location or size of the lumens, which are representative illustrations.

Geometries other than cylindrical can be used. Examples include, but are not limited to, rectilinear shapes, triangular shapes, elliptical shapes, and the like. The actuator cylinder 210 can be made of plastic or metal. The material can be relatively easy to form. Example forming processes for the actuator cylinder 210 include, but are not limited to, machining, such as by drilling, micro-molding, micro-casting and the like.

FIG. 2B also illustrates a pump motor stator 212. The stator 212 can form a part of a micro-solenoid in which the actuator 202 is the rotor. In such examples, a ring of ferrous material, such as soft iron or another material can be attached to the outer surface of the cylinder 214. A plurality of lumens 206, optionally hundreds of small tubes (e.g., micro-tubes or µ-tubes) can be formed in the cylinder 214. Example forming processes for the lumens include, but are not limited to, drilling, such as laser or ultrasound drilling, injection-molding, micro-casting and the like. The actuator 202 can have diameter of 2, 5, or 10 mm and length of 5-20 mm. Each micro-tube has the same length of, say 10 mm, and the diameter of 25 (SHP), 50 (HP), 100 (MP), to 200 (LP) micrometers.

An SDMFPC with diameter of 5 mm and length of 10 mm can include 500 micro-tubes of 100 micrometer diameter. The forward stroke can be 2 mm achieved in 100 milliseconds (10 Hz) resulting in an average forward speed of 20 mm/s.

In examples using a rectified-sine waveform (see, e.g., FIG. 13), the average forward speed can be 14 mm/s. The average speed of the fluid for medium pressure gradients can be 11 mm/s. The return stoke can be the same length (e.g., 2 mm) but of shorter duration, e.g., 1 millisecond (1000 Hz or 1 kHz). The average return speed can be thus 2 m/s (2000 mm/s).

In examples using an inverted rectified-sine waveform the average return speed can be 1.4 m/s (1400 mm/s). The return stroke can affect or only affect a thin layer and cause return flow while the bulk fluid can still be moving forward. Thus in such instances the cycle-averaged forward speed can be around 10 mm/s for moderate pressure gradients. Super-high-performance (SHP) SDMFPs can have average forward speed in the range 30-50 mm/s.

Figure 3:
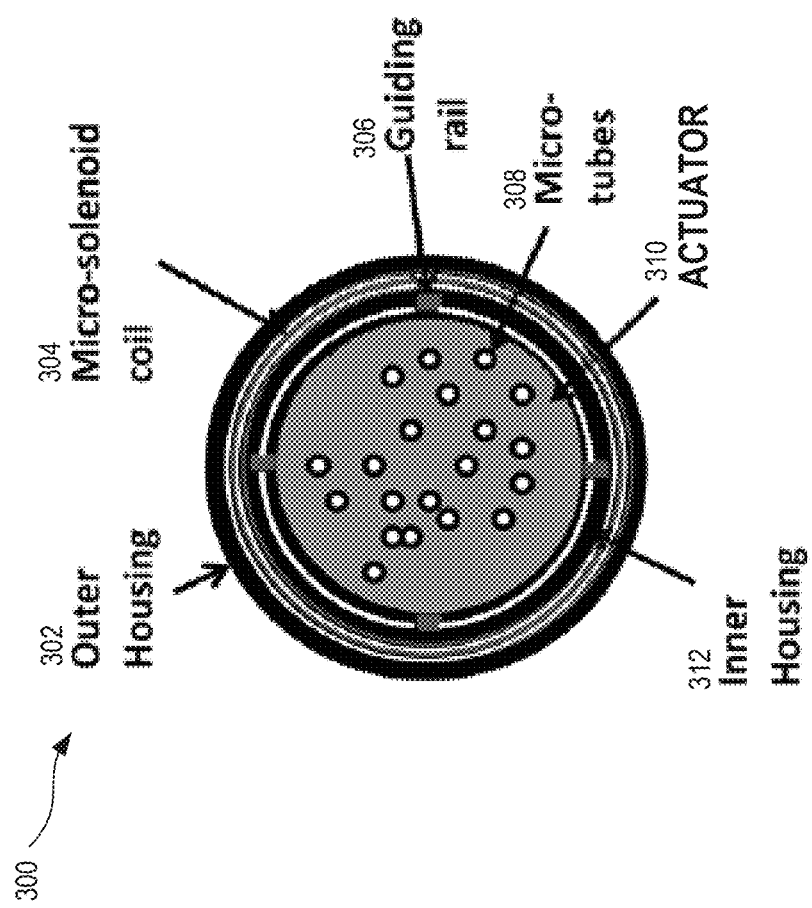
FIG. 3 is the top view of an actuator including a plurality of guiding rails, according to an example.

FIG. 3 is a cross-sectional view of an actuator assembly 300 including a plurality of guiding rails, according to an example. An outer housing 302 can house a micro-solenoid coil 304. The micro-solenoid coil can be sandwiched between the outer housing 302 and an inner housing 312. The inner housing can form a housing for the actuator 310. A small clearance, e.g. of about 10-20 micrometers, can be defined between the plunger/actuator and the inner water-tight housing. As disclosed herein, the actuator 310 can include lumens such as micro-tubes 308. The cross-sectional view illustrates guiding rails 306 that can provide for pump actuation into an out of the page, while resisting rotation around an axis into the page.

Figure 4:
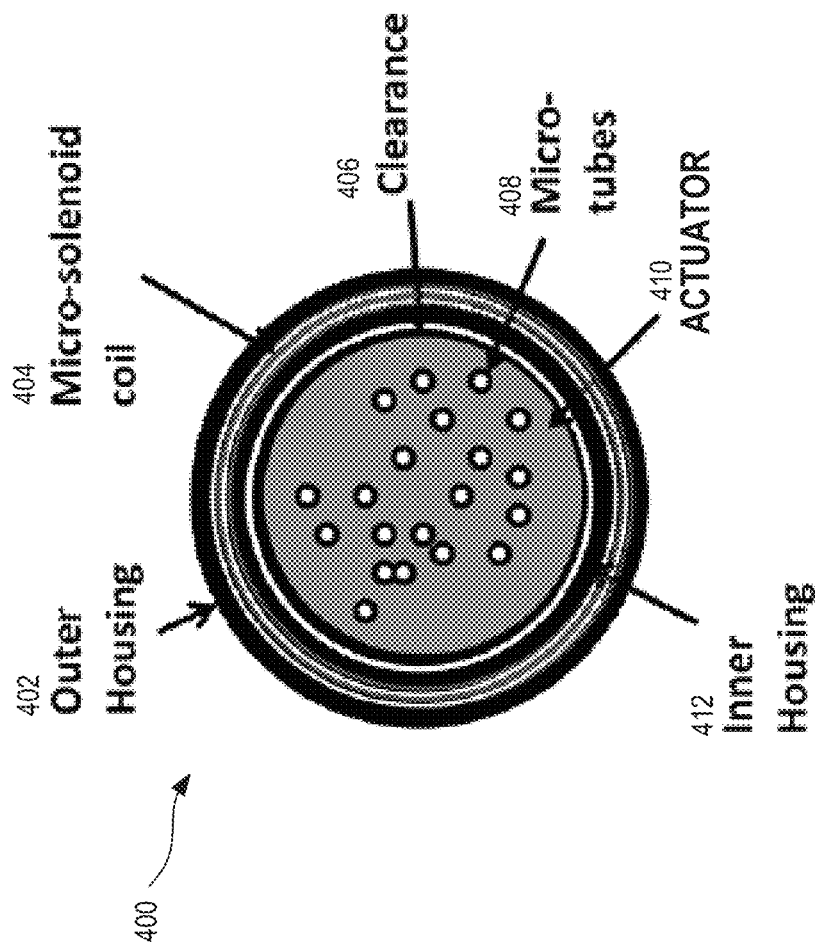
FIG. 4 is the top view of an actuator including a plurality of guiding rails, according to an example.

FIG. 4 is the top view of an actuator assembly 400 including a plurality of guiding rails, according to an example. An outer housing 402 can house a micro-solenoid coil 404. The micro-solenoid coil can be sandwiched between the outer housing 402 and an inner housing 412. The inner housing can form a housing for the actuator 410. A small clearance 406, e.g. of about 10-20 micrometers, can be defined between the plunger/actuator and the inner water-tight housing. As disclosed herein, the actuator 410 can include lumens such as micro-tubes 408. The cross-sectional view illustrates an absence of guiding rails. Accordingly, the actuator 410 is free to rotate around an axis into the page. As disclosed herein, the actuator 410 can be magnetic. The actuator 410 can be formed as a composite including a magnetic portion, such as a coating or jacket.

Figure 5:
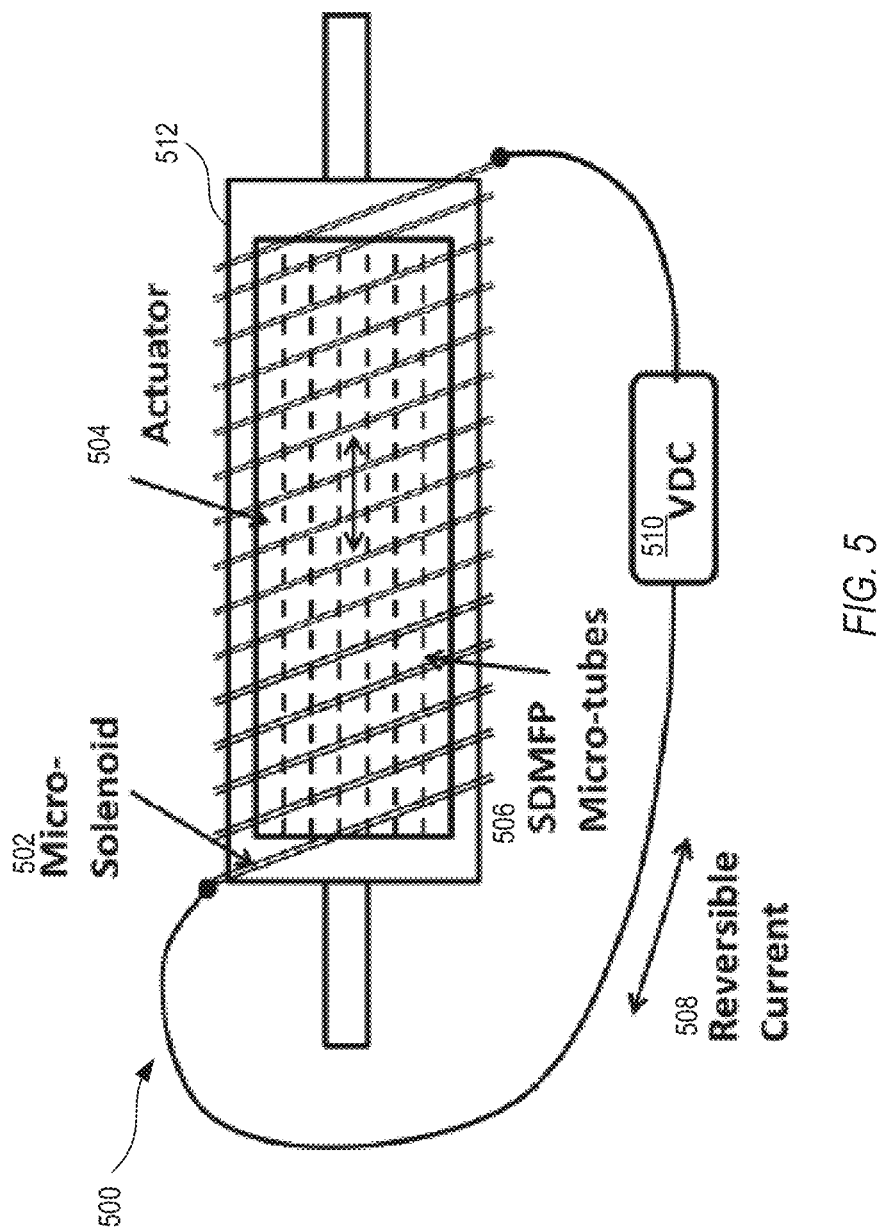
FIG. 5 is a side view of an actuator drive, according to an example.

FIG. 5 is a side view of an actuator drive 500, according to an example. The actuator 504 is slideably disposed in inner housing 512. A micro-solenoid coil 502 can be coiled around it the inner housing 512. The current direction and strength in the coil can be controlled by microcontroller to deliver slow forward and fast return movements. The controller can coordinate the operation of a voltage source 510 to provide DC voltage. The polarity of the voltage source 510 can be reversed to encourage pumping. The current 508 can be reversible. Accordingly, SDMFP examples can be bi-directional, in that they can reverse pumping direction, such as by changing actuation.

Figure 6:
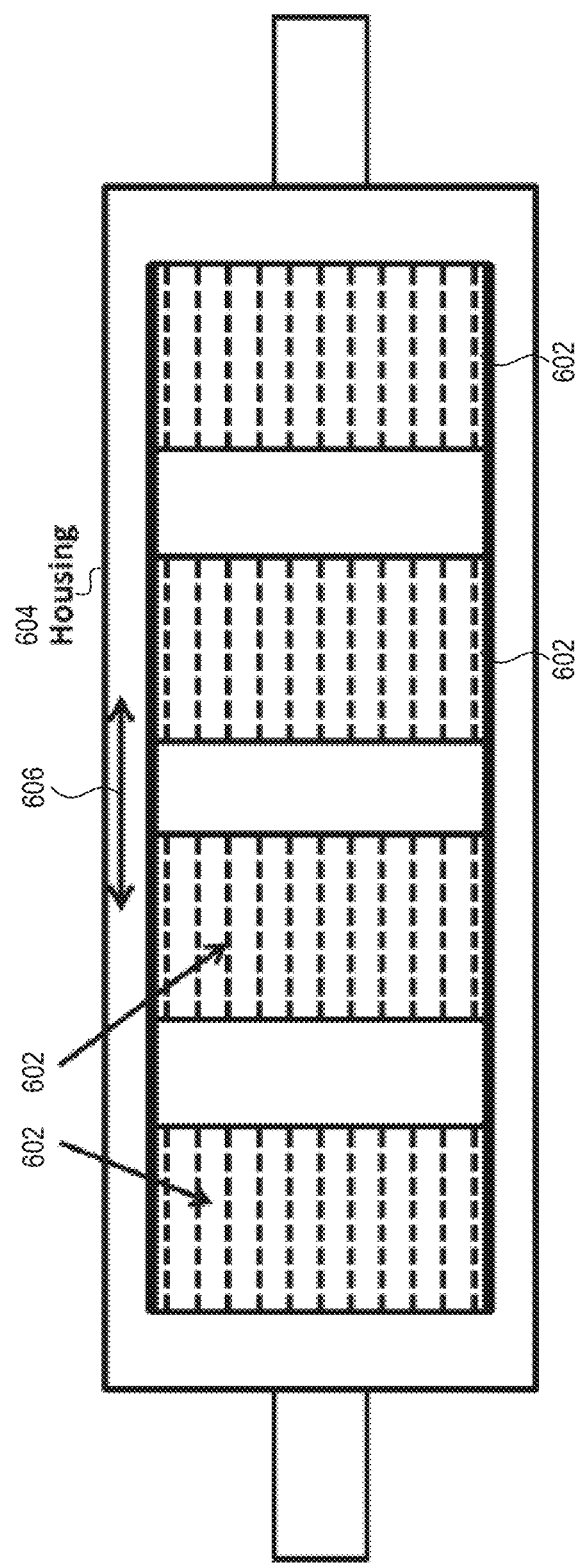
FIG. 6 is a schematic of a multiple actuator pump, according to an example.

FIG. 6 is a schematic of a multiple-actuator pump, according to an example. A SDMFP for SHP (Super High Pressure) can provide increased performance with multiple short actuators 602 disposed in a housing 604 to increase entrance effects in return stroke. The actuators 602 can move in unison.

Figure 7B:
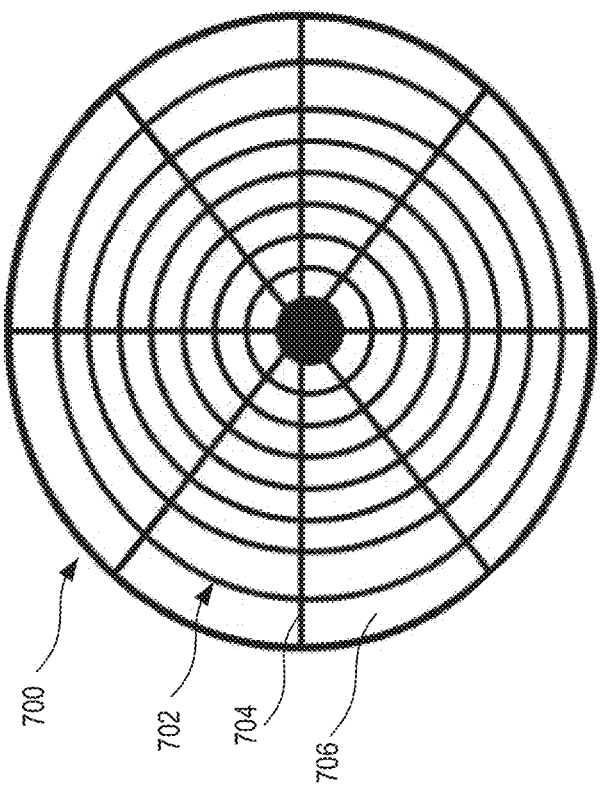
FIG. 7B is a cross-sectional view of an actuator include annular and radial divisions, according to an example.
Figure 7A:
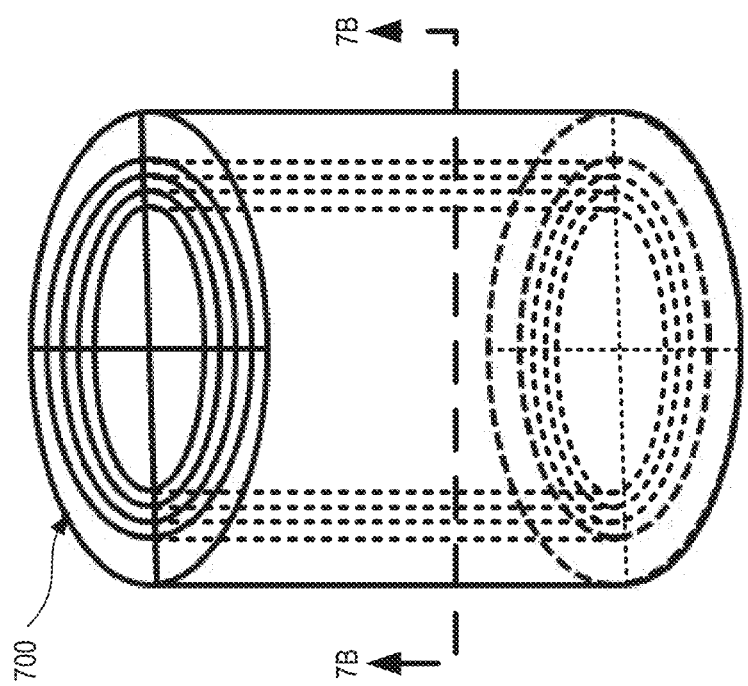
FIG. 7A is an elevated perspective view of an actuator including annular and radial divisions, according to an example.

FIG. 7A is an elevated perspective view of an actuator 700 including annular and radial divisions, according to an example. FIG. 7B is a cross-sectional view of an actuator 700 including annular and radial divisions, according to an example. A shear-driven micro-fluidic pump, annular ("SDMFPA"), including an annular actuator 700, can be formed by several processes, including, but not limited to, micro-machining, injection micro-molding and micro-casting. The material can be plastic or metal. Thin co-axial cylinders 702 intersect radial spreaders 704 to form thin curved slits 706 that can be used to transport fluid by the periodic non-harmonic excitations disclosed herein.

The geometric dimensions of the shear-driven micro-fluidic pump, cylindrical ("SDMFPC") can be used as in the SDMFPA. The SDMFPA can offer a higher luminal cross-sectional area when compared to the SDMFPC. Among SDMFPA slits, the same slit heights, e.g. 50, 100 or 200 micrometers can be formed around a circumference of the SDMFPA. Slits can vary in height from ring to ring.

The actuator can be comprised of co-axial cylinders intersected by radial spreaders defining a plurality of curved slits. Each of the slits can have a slit-bisecting arc length of from 25-200 micrometers. Each of the slits can have a radial width of around 50 micrometers. At least one of the co-axial cylinders can be around 50 micrometers in thickness.

The SDMFPA can define less solid surface, which can lead to lower pumping effort. The co-axial design of the SDMFPA can be used for high flow ("HF") with medium pressure ("MP") or low-pressure ("LP") performance. The actuator can be manufactured inexpensively. The thickness of the co-axial cylinders can be constant (e.g., 50 micrometers; e.g. a foil such as a metal foil). The SDMFPA can be easier to manufacture by injection micro-molding and micro-casting than drilling hundreds of micro-tubes. If a micro-solenoid is used as a driving principle, a stator can surround an actuator housing, and the actuator 700 can be made of thin cylindrical metal foils that comprise a rotor.

Regarding any of the actuators disclosed herein, if the Womersley number exceeds 10, the size of the channel/duct can be tenfold Stokes' penetration depth. Accordingly, some or most of the fluid does not experience the presence of the oscillating wall. For a Womersley number less than one the diffusion length can be on the order of the geometrical length of the actuator and all the fluid can move in-phase with the moving boundary. The forward stroke can be relatively slow and pull the fluid forward. The return stroke can be very fast and affects the thin layer close to wall. Effectively such non-harmonic (period) oscillations can result in net forward flow (pumping). The smaller the duct scale the faster it can be to move in forward and return stroke. Simultaneously, a smaller duct can be used to overcome higher backpressures.

High-performance ("HP") and super-high-performance ("SHP") ducts, such as micro-tubes, can have small diameters (10 to 50 micrometers) and can be used in forward stroke with the frequency of 20-50 Hz and in return stroke of 2-5 kHz. The driving frequencies in the forward and return stroke for the given micro-tube diameter can be determined in association with a determined fluid kinematic viscosity. In the forward stroke the fluid velocity in the core region can be less than 80% of the average wall velocity. On the other hand, the return stroke frequency can be very high. In certain examples, the interior fluid velocity (e.g., at the center of the tube) does not decrease below 10% of the maximum wall velocity.

The return Reynolds number can be 100 times larger than forward Re-number on average. During the fast return stroke the flow can remain substantially laminar. Turbulence onset and large amplitude entrance effects of Tolmien-Schlichting waves can have little or no time to develop and can be quickly suppressed if they do develop. If the Reynolds number is 1000 (SHP) in rapid return, the flow can remain laminar. The time for oscillation period can be about 2-orders of magnitude shorter than for diffusive transport in return stroke. Accordingly, the momentum from the wall resists penetration deep into fluid during the return stroke.

Figure 9:
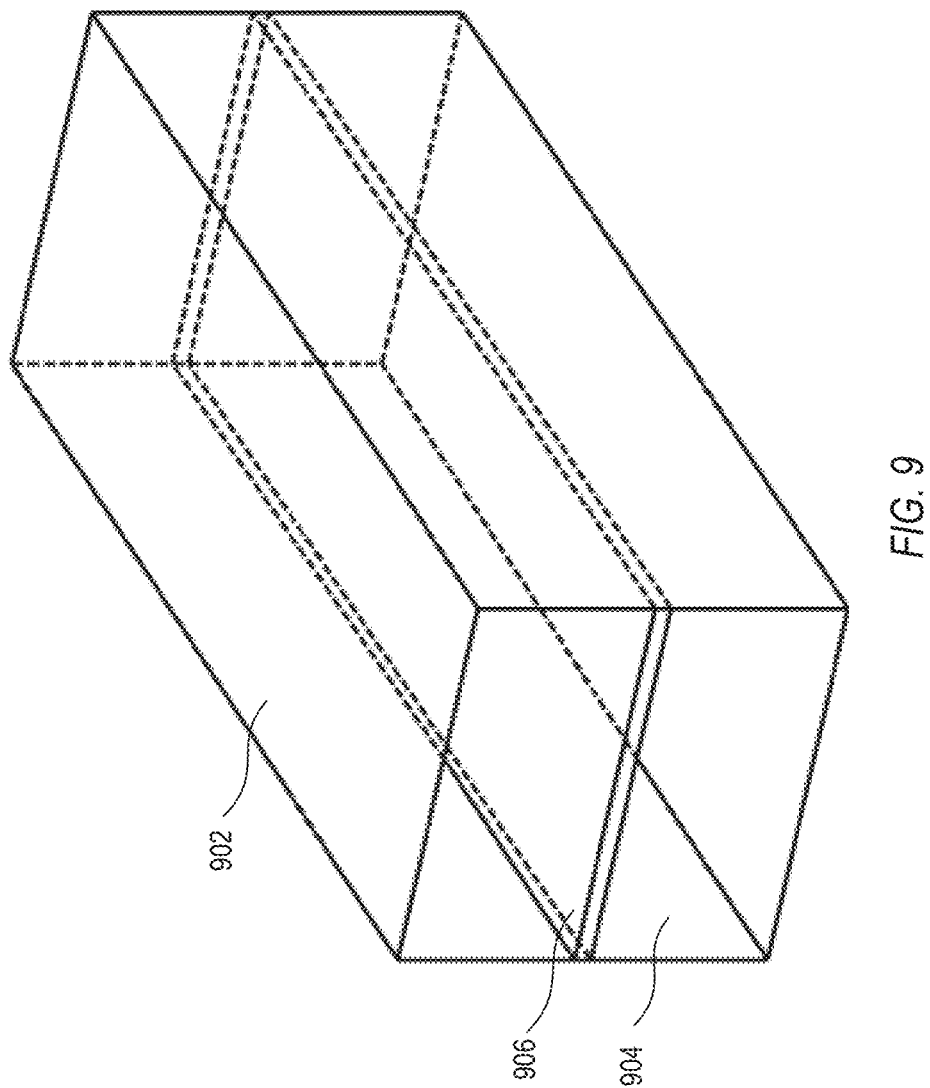
FIG. 9 is an elevated perspective view of a rectangular plunger including flaps, according to an example.

FIG. 8 can be a schematic showing valve function, according to an example. An SDMFP can include a microvalve. A Gurney-type flap that resembles a leaf-spring with a small tab at the end can be used to amplify hydrodynamic or inertial forces as desired. An elastic flap 802 can close in actuator return stroke. The closing can be contributed to or caused by pressure and inertial forces. In the slow forward stroke the tab 804 can create hydrodynamic forces and the moments that can overcome spring effect and open it fully against the upper wall in the rectangular channel, e.g. as shown in FIG. 9. A leaf-spring hysteresis can be used to improve pumping action. Very high pressure can be achieved by combining shear and valve action.

Several other pumping mechanisms can be combined with and without micro-valves to enhance pumping efficiency. For example, we can use surface forces in the 4 corners of a rectangular plunger to provide additional pumping due to moving contact lines and surface forces dynamics.

Some SDMFP designs do not include microvalves. When Gurney-flap type microvalves are used larger channel dimensions can be used, and higher pressures can be achieved.

FIG. 9 is an elevated perspective view of a rectangular plunger including flaps, according to an example. It shows a first channel 902 and a second channel 904, with a center plate 906 that can be coupled to one or more valves.

Figure 10:
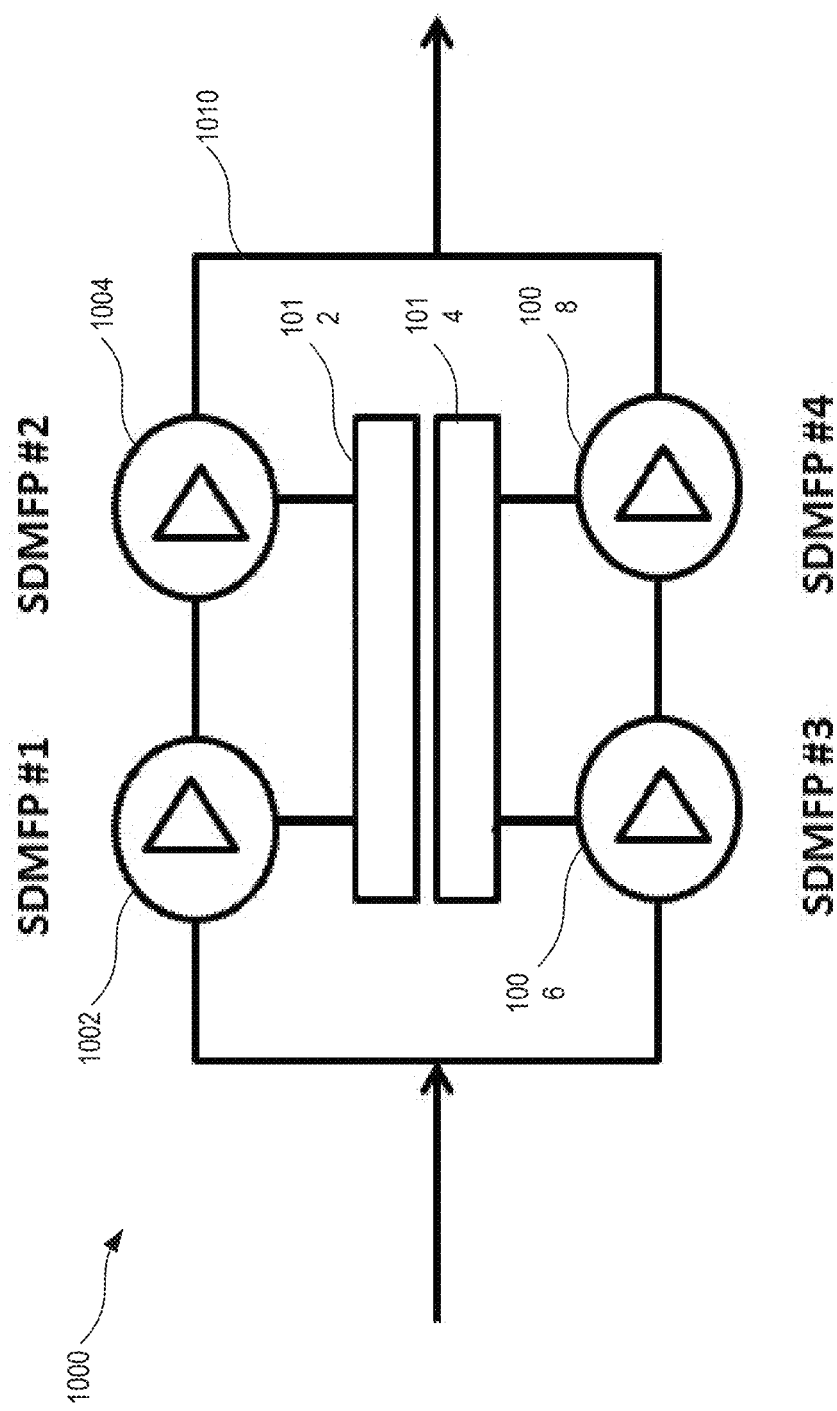
FIG. 10 is a schematic of a pump configuration including two pumps and two actuators, according to an example.

FIG. 10 can be a schematic of a pump configuration including two pumps and two actuators, according to an example. SDMFPs can be arranged to work in serial-parallel combination and powered by one or more drivers as shown with an example in FIG. 10. The pump 1002 can be a first pump, and a second pump 1006 can be coupled to the circulation loop 1010 in parallel with the first pump. A third pump 1004 can be coupled to the circulation loop 1010 in series with the first pump 1002. A fourth pump 1008 can be coupled to the circulation loop 1010 in parallel with the third pump 1006. For certain operations one driver can be shut-down.

Four SDMFPs can be integrated into one housing (say, L30×W15×H15 mm). Two SDMFP 1002, 1004 can be in a series can be powered by one micro-actuator 1012 such as a micro-solenoid. The other parallel two SDMFPs 1006, 1008 can be powered by a second micro-actuator 1014. An entire side can be shut for a part of a heat-transfer operation when a power consumption reduction is desired.

FIG. 11A illustrates a first mode of operation of a two-actuator pumping system, according to an example. FIG. 11B illustrates a second mode of operation of a two-actuator pumping system, according to an example. FIG. 11C illustrates two actuators aligned in series to pump fluid, according to an example. Actuators 1102-1108 of a first pump 1108 and a second pump 1110 can move in unison or against each other.

Several actuators can work in serial/parallel combination to increase head and/or flow rates (capacity). For very high pressures an actuator can be split into several smaller cylinders to enhance entrance flow effects in reverse strokes.

Certain examples split the actuator into several shorter components to improve tube entrance effects in return stroke, which can reduce pump leakage. For example, for a 100 micrometer radius micro-tube with $H_2O$ and effective constant wall drift speed of 5 mm/s, the adverse pressure gradient that can be overcome is 4,000 Pa/m (4 kPa/m or 40 mbar/m). The pumping effort of 10 mm actuator can be 40 Pa. In the case of a 50 micrometer micro-tubes (e.g., with a diameter of 100 micrometers) the effective wall speed can be 15 mm/s, the maximum pressure gradient can be 192 kPa/m or 1920 Pa (1.92 kPa or 19.2 mbar) maximum pumping effort.

Two actuators in a series can deliver around 4,000 Pa (4 kPa or 40 mbar) pumping effort. A Super-High-Pressure SDMFPC can deliver 10,000-100,000 Pa (10-100 kPa or 100 to 1000 mbar) alone and the micro-tubes can be about 25-30 micrometers in diameter. The cylinder actuator length can be 10, 15, or 20 mm long split into several shorter cylinders of 3-5 mm length and free space of 3 mm in between. Such a pump can be longer (15 to 20 mm) but can produce improved pressures at improved volume flow rates. One of the reasons to split the cylinder into several smaller ones is to enhance the constructive tube flow entry effects. By splitting the pump into parallel-serial combination once can reduce the effect of high peak power using large actuator drives.

Figure 12:
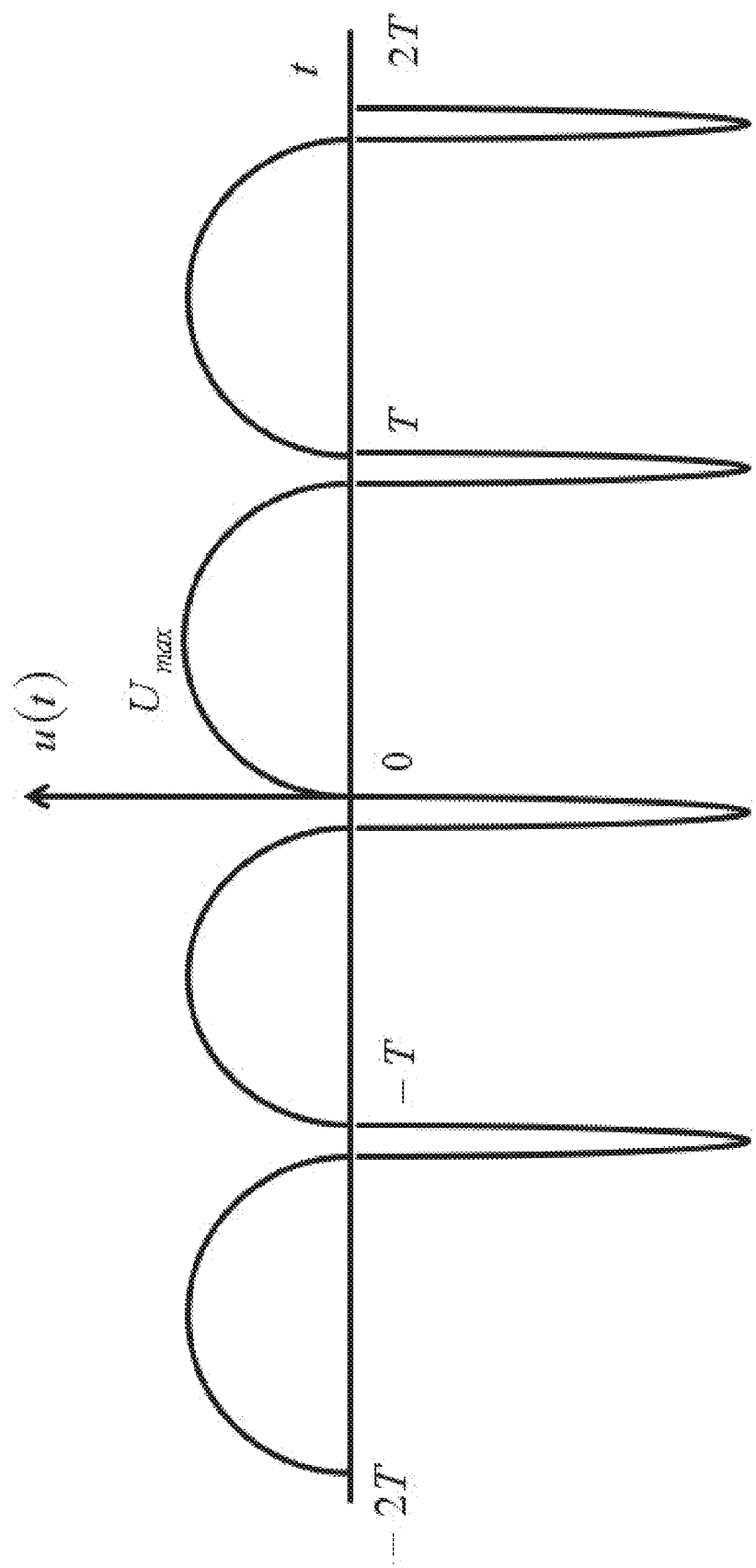
FIG. 12 illustrates a rectified-sine (absolute sine) form illustrating a quick return driving waveform, according to an example.

FIG. 12 illustrates a rectified-sine (absolute sine) form illustrating a quick return driving waveform, according to an example. Non-harmonic pumping can be important, in combination with shear forces, to the efficacy of SDMFP pumping. Designing driving waveforms can be important in SDMFP efficient operation. One waveform can be rectified sine-function (absolute sine) followed by a rapid inverted sine as shown. The area under the curve can be equal for both curves (distance can be the same and the motion can be periodic). The return stroke velocity (and associated Reynolds number) can be about 100 times faster in return stroke than in forward stroke.

Figure 13:
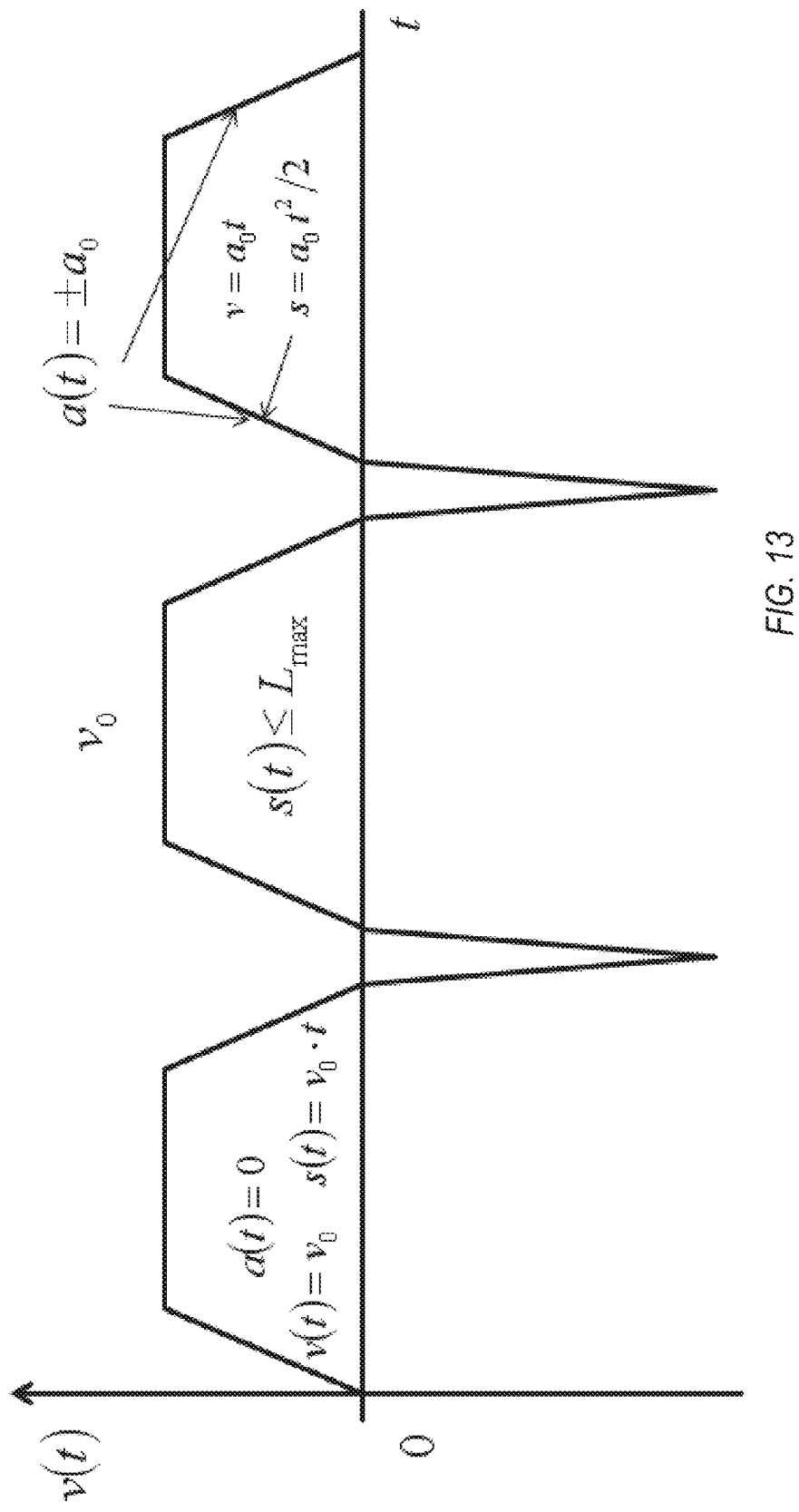
FIG. 13 illustrates a square-type driving waveform, according to an example.

FIG. 13 illustrates a square-type driving waveform, according to an example. The SDMFP plunger can coast between rapid acceleration and decelerations.

Figure 14:
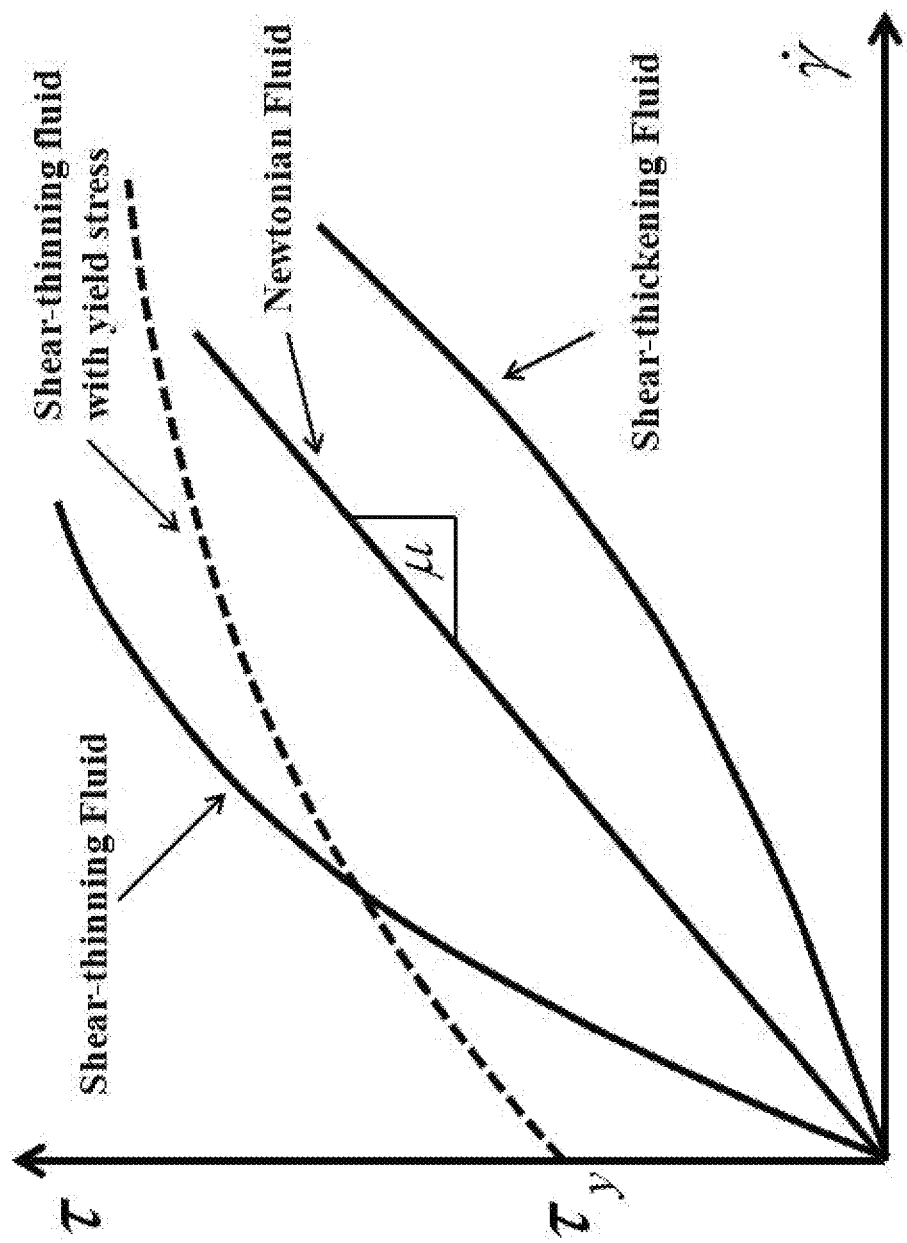
FIG. 14 illustrates behavior of a non-Newtonian fluid, according to an example.
Figure 15:
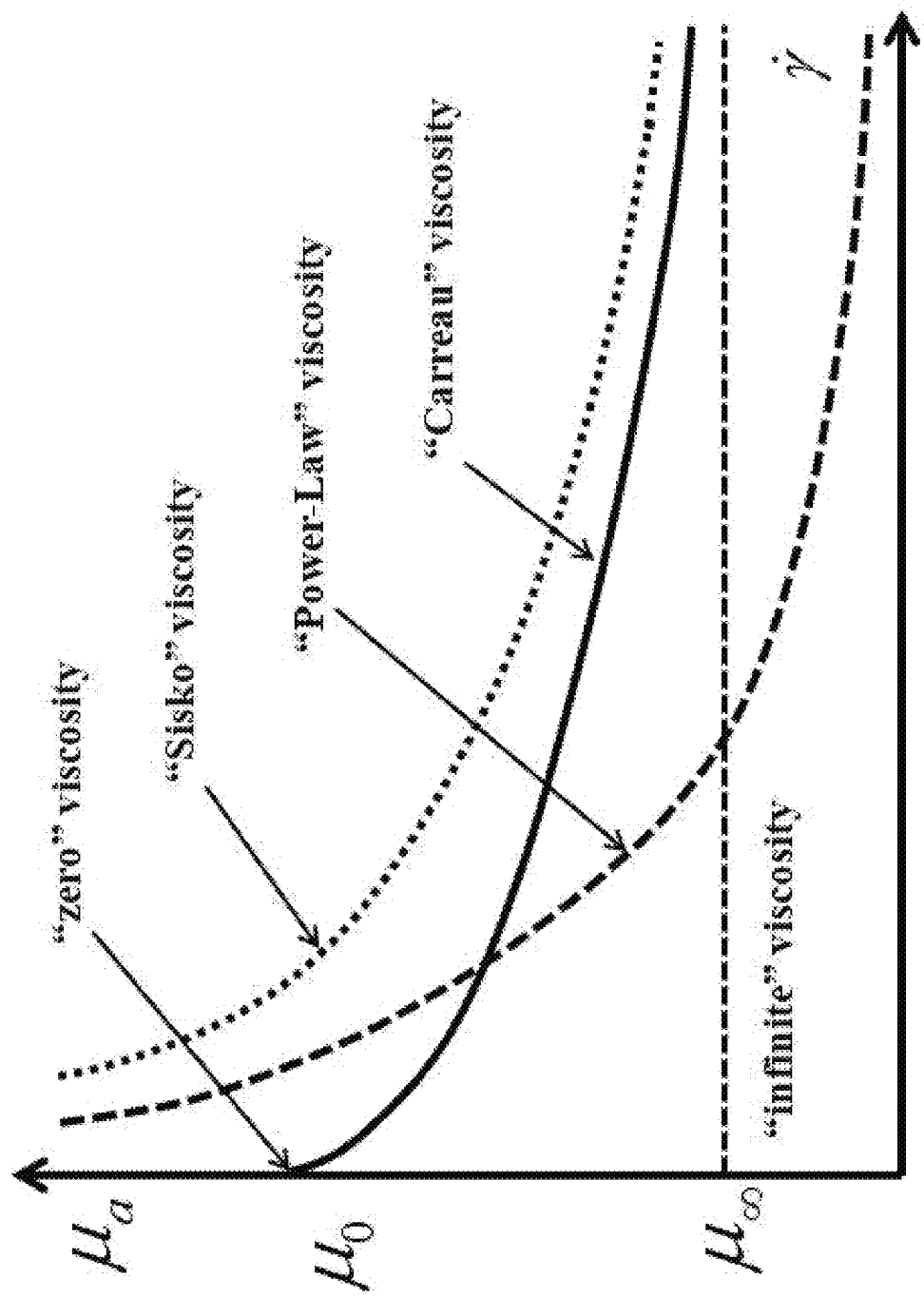
FIG. 15 illustrates behavior of a non-Newtonian fluid, according to an example.

FIG. 14 illustrates behavior of a non-Newtonian fluid, according to an example. FIG. 15 illustrates behavior of a non-Newtonian fluid, according to an example. Hydraulic SDMFP performance characteristics can be enhanced if a shear-thinning (pseudo-plastic) time-independent non-Newtonian fluid is used as a working fluid. An illustration of basic time-independent non-Newtonian (or Generalized Newtonian) fluids is shown in FIGS. 14-15. One result is enhanced plug like flow of the fluid interior. This can be especially beneficial in certain applications. For example, in pumping blood in coronary arteries where shear rates can be small enough that shear-thickening becomes important, an SDMFP can be perform desirably.

Drag reduction techniques using Moffat-vortices principle, fish-scales micro-geometry, impulse heating and special thin layers can increase friction drag in one direction and lower it in another, which can benefit performance. Coatings on the actuator can increase shear in one direction and decrease it in another, thus additionally increasing volumetric efficiency.

Figure 16:
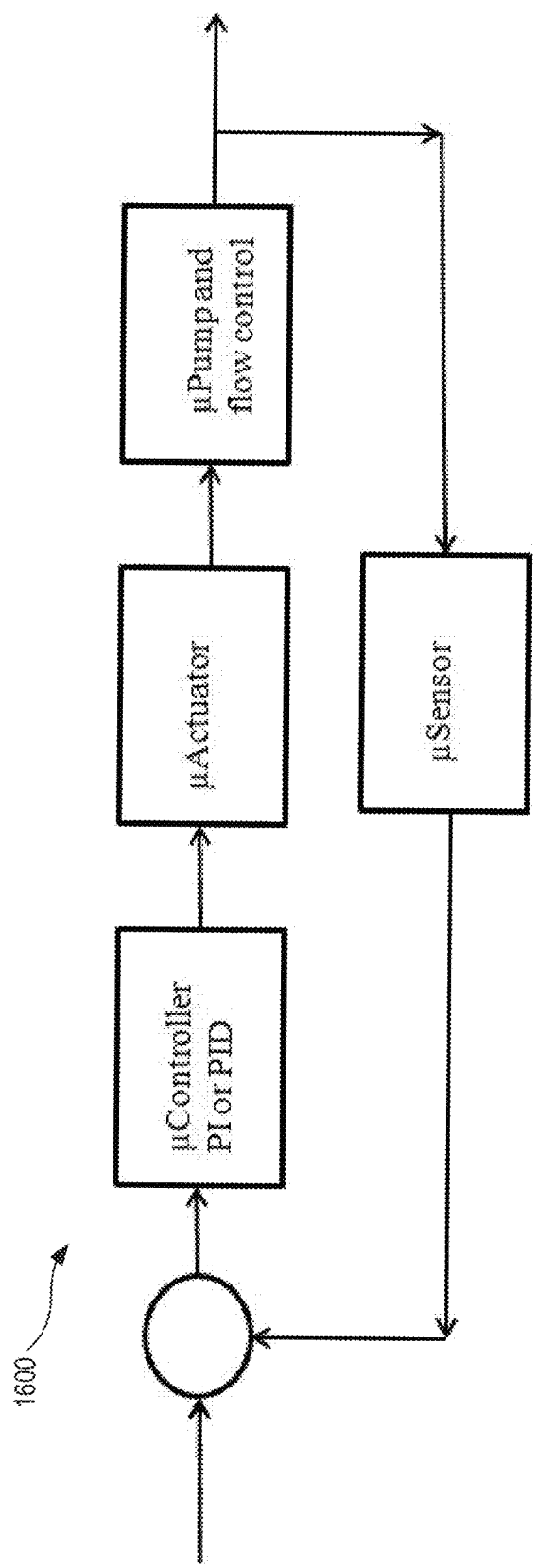
FIG. 16 illustrates a negative feedback control loop, according to an example.

FIG. 16 illustrates a negative feedback control loop, according to an example. The SDMFP can respond well to continuous control. A simple feedback control 1600 can be designed to adjust pump working parameters (e.g., one or both of flow rate and pumping effort). Adaptive control can be used. As disclosed herein, micro-sensors can be embedded in a micro-pump and can provide necessary information to microcontroller to regulate pump operating set-point.

Micro-actuators can deliver high torque/force in the return stroke and can be power-limited. The forward stroke can require much less power but can be energy-limited. The stroke length can be 0.5 to 5 mm and that has to be taken into consideration. Most likely actuator candidates can be (1) Micro-solenoid. (2) Linear DC motor, and (3) Piezo-electric transducer with force/stroke converters. A system can be remotely controlled.

Figure 17:
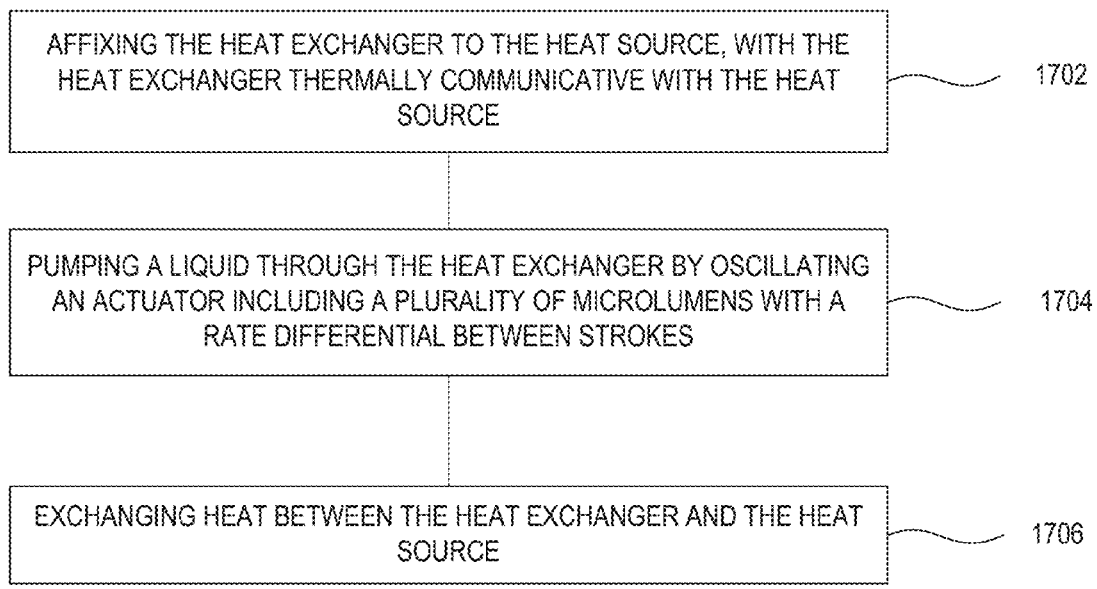
FIG. 17 illustrates a method of using a pump, according to an example.

FIG. 17 illustrates a method of using a pump, according to an example. Examples can include a method for heat exchange between a heat source and a heat exchanger. At 1702 the method can include affixing the heat exchanger to the heat source, with the heat exchanger thermally communicative with the heat source. At 1704 the method can include pumping a fluid through the heat exchanger by oscillating an actuator including a plurality of microlumens with a rate differential between strokes. This can include pumping a fluid through the heat exchanger, at a determined flow rate and fluid pressure, by oscillating an actuator in a pump housing extending along a length defining an elongate interior, the actuator conforming to the elongate interior, the actuator including a plurality of lumens, each having a length extending substantially parallel to the elongate interior, each from around 20 to 200 micrometers across, wherein an oscillation takes place with a rate differential between movement in a first direction versus movement in a second direction opposite the first direction. At 1706 the method can include exchanging heat between the heat exchanger and the heat source.

Optional methods can be used. Pumping can include pumping the fluid at a minimum of 80% of an actuator speed. Pumping can include maintaining a Reynolds number of the fluid while the actuator can be moving in the first direction to be 1/100th the Reynolds number of the fluid while the actuator can be moving in the second direction. Pumping can include sensing a flow rate and adjusting the oscillation in association with the flow rate. Pumping can include sensing a differential pressure and adjusting the oscillation in association with the differential pressure. Pumping can include sensing a temperature and adjusting the oscillation in association with the temperature. Pumping the fluid can include pumping at a flow rate of up to 100 milliliters per second, at a pressure of up to 40 kilopascals.

Applications

The apparatuses, systems and methods discloser herein can be used in fluid cooling. The SDMFP has by its nature a wide dynamic range, i.e., flow rate and net pressure head can be varied over several orders of magnitude. This can be something that can be not available with other commercially available micro-pumps. The forward and return stroke frequencies (periods) can be adjusted over a wide range to deliver variable oscillations dynamics. Due to the high-bandwidth of the return stroke a lot of space can be left for accurate flow and effort control with high resolution. Adding another SDMFP in a circulation system we can offer flow rates up to 100 mL/min and total effort up to of 40 kPa (400 mbar). On the other hand the same SDMFP can provide accurate low rates of only several μL/min.

Certain applications benefit from the housing shape and actuator drivers. External size can be about 5 to 30 mm in length and 5 to 10 mm in depth and 10-15 mm in width and it would be used mostly in fluid-cooling systems. A microfluidic system that employs pumping can use this pump.

Various pump applications can include microelectronic cooling, biomedical/medical, space industry, food processing, automotive, and micro-propulsion (aeronautics and space propulsion). Aerospace applications can include use as pressurized fuel delivery for micro-jet engines and/or fluid propellant for micro-rocket engines. Example applications can include micro-thrusters for micro-satellites, for example for orbital, attitude control, and/or main propulsion.

As the heat release of the new multi-core processors increases the need for fluid cooling can be more pronounced. Certain examples can be used to exchange heat with a chip, CPU, IC and other circuits. Heat generating MEMS devices can also be cooled. A number of applications from fluid cooling of microelectronic circuits (e.g., multi-core processors) can use custom cooling strategies (including convective cooling without phase-change and pool/forced flow boiling with phase-change).

A CPU can release 100 W Peak-Power to be absorbed in micro-channel convective heat exchanger, transported, and rejected in heat sink. A heat-sink in existing micro-electronics (e.g., PC's) includes a finned metallic heat exchanger air-cooled (forced convection) by the computer fan/ventilator.

The single-phase fluid convection-conduction based removal of heat through micro-channels embedded in multi-core CPU can use about 30-60 mL/min of water as a coolant and the pressure drop in an entire cooling loop can be on the order of 15,000-500,000 Pa (150-5000 mbar).

For a two-phase heat-removal cooling system that utilizes pool or forced boiling (immersed cooling) lower flow rates of water fluid coolant can be used or for the same flow rates the heat removal can be on order of 1 kW (e.g., using water phase change). The capacity to remove heat from high-power electronic components can be ten to hundredfold utilizing a phase-change flow system.

If the coolant fluid is distilled clean water (simplest solution) then dynamic viscosity can be $10^{-3}$ Pa sec (1 mPas or 1 cP) and density can be $10^3$ kg/m$^3$. Coolant can enter a stacked micro-channels or CPU-embedded heat exchanger pool at, say 40° C. With phase change water warmed up to 100° C. (e.g., at 1 bar absolute pressure) the phase-change can take place to produce vapor-fluid mixture (bubbly or slug flow).

The SDMFP can deliver the effort at designed flow rate (e.g., capacity). The total micro-pump efficiency can be 10%-30%. The power requirements for a shear-driven micro-fluidic pump can be on the order of ten milli-Watts. The forces necessary to move the actuator can be on the order of ten milli-Newton. Accordingly the micro-solenoids and piezoelectric force transducers can power SDMFPs.

For medical and biomedical purposes to assist human hemodynamic circulation the SDMFP can be installed in vascular channels (body) directly. Many biomedical and medical applications can benefit from a use of highly efficient, low-power consumption, safe shear-driven micro-fluidic pump design. Whether it embedded design SD-MFP assisting human blood circulation in systemic or coronary hemodynamics for people with cardio-vascular difficulties/diseases or delivering on-demand insulin for diabetic patients, the shear-driven micro-fluidic pump exhibits efficient performance.

The pumps can be very small to be surgically inserted into vascular channels (arteries, arterioles, etc.). Since SDMFP concept can be relatively efficient it can operate for years on small batteries. For example, for 10 mW pumping power and with low 20% total efficiency (e.g., pumping leakage and actuator efficiency) an average 50 mW of electric power is used by the pump (e.g., 10 mA with 5V source, e.g. a DC computer CPU voltage). If the SDMFP works 10 hours at maximum power per day (e.g., average power over 24 hours normalized), then for one year (365 days) the pump can consume 182.5 W-hr (36.5 A-hr) or 0.1825 kW-hr/year.

The peak power required to accelerate the actuator on the order of several G in return stroke can be on the order of 100 mW. Capacitors can be used to store electrical energy necessary for quick discharge and peak power. The pump actuating cylinders resemble hollow devices, and are thus light, but have mass that can experience a large number of cycles. For example, a pump can work over a period of 5 years. The forward stroke can repeat 2-10 times per second, resulting in around 800 million relatively slow forward strokes followed by rapid return strokes (e.g., of a duration of 500-2000 μs).

Additionally, the entire embedded micro-control can be remotely adjusted. The shear-driven concept can be efficient on the microscales (e.g., 10 to 500 micrometers with no microvalves). The unique concept of drag reduction (fish "scales", special layers, coating, etc.) in the return stroke and splitting the actuator into several shorter components to improve tube entrance effects in return stroke and reduce pump leakage.

Various Notes & Examples

Example 1 can include an apparatus to pump a fluid. The example can include a housing extending along a length defining an elongate interior. The example can include an actuator in the housing, conforming to the elongate interior, the actuator including a plurality of lumens, each having a length extending substantially parallel to the elongate interior, each from around 10 to 200 micrometers across. The example can include an actuator configured to oscillate the actuator in the actuator housing along the length of the elongate interior with a rate differential between movement in a first direction versus movement in a second direction opposite the first direction to pump the fluid.

Example 2 can include any of the preceding examples, wherein at least one of the plurality of lumens has a circular shape in cross-section.

Example 3 can include any of the preceding examples, wherein at least one of the plurality of lumens has a rectilinear shape in cross-section.

Example 4 can include any of the preceding examples, wherein the actuator includes a micro-solenoid to be powered by a 5V DC source.

Example 5 can include any of the preceding examples, wherein the actuator includes a linear motor to be powered by a DC source.

Example 6 can include any of the preceding examples, wherein the actuator includes a Piezo-electric transducer with a force/stroke converter.

Example 7 can include any of the preceding examples, wherein the plurality of lumens comprise from around 60% to 80% of a cross-sectional area of the actuator.

Example 8 can include any of the preceding examples, wherein the plurality of lumens comprise from around 78.5% of a cross-sectional area of the actuator.

Example 9 can include any of the preceding examples, wherein the movement in the first direction is a first distance from 0.5 to 5 millimeters in 100 to 500 milliseconds, and movement in the second direction is a second distance 0.5 to 5 millimeters in 1 to 2 milliseconds.

Example 10 can include any of the preceding examples, wherein the first distance and the second distance are substantially equivalent.

Example 11 can include any of the preceding examples, wherein the actuator is configured to move in the first direction at an average speed of around 30-50 millimeters per second.

Example 12 can include any of the preceding examples, wherein the movement in the second direction is at a frequency that is from around 100 to around 1000 times faster than movement in the first direction.

Example 13 can include any of the preceding examples, wherein the movement in the second direction is around 1000 hertz, and movement in the first direction is at around 10 hertz.

Example 14 can include any of the preceding examples, wherein the movement in the second direction is around 10000 hertz, and movement in the first direction is at around 10 hertz.

Example 15 can include any of the preceding examples, wherein the movement in the second direction is around 2000-5000 hertz, and movement in the first direction is at from around 20-50 hertz.

Example 16 can include any of the preceding examples, wherein the actuator is comprised of co-axial cylinders intersected by radial spreaders defining a plurality of curved slits.

Example 17 can include any of the preceding examples, wherein each of the slits has a slit-bisecting arc length of from 25-200 micrometers.

Example 18 can include any of the preceding examples, wherein each of the slits has a radial width of around 50 micrometers.

Example 19 can include any of the preceding examples, wherein at least one of the co-axial cylinders is around 50 micrometers in thickness.

Example 20 can include any of the preceding examples, wherein the housing is formed of at least one of plastic and metal.

Example 21 can include any of the preceding examples, wherein the housing is at least one of a micro-molded housing and a micro-cast housing.

Example 22 can include any of the preceding examples, wherein the plurality of lumens are distributed according to a regular pattern.

Example 23 can include any of the preceding examples, wherein the plurality of lumens are distributed according to a random pattern.

Example 24 can include any of the preceding examples, comprising valve disposed in the actuator.

Example 25 can include any of the preceding examples, wherein the valve includes a gurney-type valve.

Example 26 can include any of the preceding examples, wherein the actuator is made of plastic.

Example 27 can include or use subject matter from any of the preceding claims, and can include a method for heat exchange between a heat source and a heat exchanger. The example can include affixing the heat exchanger to the heat source, with the heat exchanger thermally communicative with the heat source. The example can include pumping a fluid through the heat exchanger, at a determined flow rate and fluid pressure, by oscillating an actuator in a pump housing extending along a length defining an elongate interior, the actuator conforming to the elongate interior, the actuator including a plurality of lumens, each having a length extending substantially parallel to the elongate interior, each from around 20 to 200 micrometers across, wherein an oscillation takes place with a rate differential between movement in a first direction versus movement in a second direction opposite the first direction. The example can include exchanging heat between the heat exchanger and the heat source.

Example 28 can include any of the preceding examples, wherein pumping includes pumping the fluid at a minimum of 80% of an actuator speed.

Example 29 can include any of the preceding examples, wherein pumping includes maintaining a Reynolds number of the fluid while the actuator is moving in the first direction to be 1/100th the Reynolds number of the fluid while the actuator is moving in the second direction.

Example 30 can include any of the preceding examples, wherein pumping includes sensing a flow rate and adjusting the oscillation in association with the flow rate.

Example 31 can include any of the preceding examples, wherein pumping includes sensing a differential pressure and adjusting the oscillation in association with the differential pressure.

Example 32 can include any of the preceding examples, wherein pumping includes sensing a temperature and adjusting the oscillation in association with the temperature.

Example 33 can include any of the preceding examples, wherein pumping the fluid includes pumping at a flow rate of up to 100 milliliters per second, at a pressure of up to 40 kilopascals.

Example 34 can include a heat exchange system for heat exchange with an integrated circuit, including subject matter from any of the preceding claims. The example can include a circulation loop to contain a fluid. The example can include a heat-emission portion in fluid communication with the circulation loop and configured to exchange heat with a cold source. The example can include at least one heat-absorption portion in fluid communication with the circulation loop and configured to exchange heat with the integrated circuit. The example can include a pump to pump a fluid through the circulation loop. The pump can include a housing extending along a length defining an elongate interior. The example can include an actuator in the housing, conforming to the elongate interior, the actuator including a plurality of lumens, each having a length extending substantially parallel to the elongate interior, each from around 20 to 200 micrometers across. The example can include an actuator configured to oscillate the actuator in the actuator housing along the length of the elongate interior with a rate differential between movement in a first direction versus movement in a second direction opposite the first direction to pump the fluid.

Example 35 can include any of the preceding examples, wherein the pump is a first pump, and comprising a second pump coupled to the circulation loop in parallel with the first pump.

Example 36 can include any of the preceding examples, wherein the actuator is configured to oscillate the first pump and the second pump.

Example 37 can include any of the preceding examples, comprising a third pump coupled to the circulation loop in series with the first pump.

Example 38 can include any of the preceding examples, comprising a fourth pump coupled to the circulation loop in parallel with the third pump.

Example 39 can include any of the preceding examples, wherein the pump is from around 30 millimeters in length, 15 millimeters in width and 15 millimeters in height.

Example 40 can include any of the preceding examples, wherein the actuator is configured to oscillate the third pump and the fourth pump.

Example 41 can include any of the preceding examples, wherein the pump is a first pump, and comprising a second pump coupled to the circulation loop in series with the first pump.

Example 42 can include any of the preceding examples, wherein the integrated circuit forms a part of a computer comprising a random access memory.

Example 43 can include any of the preceding examples, wherein the integrated circuit forms a part of a computer comprising an embedded processor.

Example 44 can include any of the preceding examples, comprising a flow rate sensor to sense a flow rate, wherein the pump is configured to adjust the oscillation in association with the flow rate.

Example 45 can include any of the preceding examples, comprising a temperature sensor to sense a temperature, wherein the pump is configured to adjust the oscillation in association with the temperature.

Example 46 can include any of the preceding examples, comprising a differential pressure sensor to sense a differential pressure, wherein the pump is configured to adjust the oscillation in association with the differential pressure.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random-access memories (RAMs), read-only memories (ROMs), and the like.

The above description is intended to be illustrative, and not restrictive. For example, the above-described examples (or one or more aspects thereof) can be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it cannot be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method comprising:
providing a pump housing defining an elongate interior that extends along a length of the pump housing, wherein the pump housing includes a piston in the pump housing, wherein the piston includes a first plurality of lumens, and wherein each lumen of the first plurality of lumens has a length extending substantially parallel to the elongate interior;
pumping a fluid by oscillating the piston in the elongate interior in the pump housing, wherein, in a first mode, each cycle of the oscillating has a rate differential between piston movement in a first direction versus piston movement in a second direction opposite the first direction to cause more of the fluid to move in the first direction than in the second direction.

2. The method of claim 1, wherein, in a second mode, the oscillating has a rate differential between piston movement in the first direction versus piston movement in the second direction opposite the first direction to cause more of the fluid to move in the second direction than in the first direction.

3. The method of claim 1, further comprising:
affixing a heat exchanger to a heat source, with the heat exchanger thermally communicative with the heat source, wherein the pumping of the fluid includes pumping the fluid through the heat exchanger at a determined flow rate and a fluid pressure; and
exchanging heat between the heat exchanger and the heat source.

4. The method of claim 1, wherein the pumping includes pumping the fluid, wherein a speed of the fluid is at a minimum of 80% of a speed of the piston.

5. The method of claim 1, further comprising sensing a flow rate and adjusting the oscillating based on the sensed flow rate.

6. The method of claim 1, wherein each lumen of the first plurality of lumens has a width in the range of around 1 micrometer to 1 millimeter.

7. The method of claim 1, wherein the pumping of the fluid includes sensing a differential pressure and adjusting the oscillation based on the sensed differential pressure.

8. The method of claim 1, wherein the pumping of the fluid includes sensing a temperature and adjusting the oscillation based on the sensed temperature.

9. The method of claim 1, wherein the pumping of the fluid includes pumping human blood.

10. The method of claim 1, wherein, in a third mode, the pumping of the fluid includes using a motion configured to windmill the fluid.

11. An apparatus to pump a fluid, the apparatus comprising:
a pump housing;
a piston in the pump housing, wherein the piston includes a first plurality of lumens, and wherein each lumen of the first plurality of lumens has a length extending substantially parallel to the length of the piston,
wherein, in a first mode, the piston repeatedly moves relative to the pump housing with a rate differential between movement in a first direction and movement in a second direction opposite the first direction in order to generate piston oscillation, wherein the piston oscillation causes more of the fluid to move in the first direction than in the second direction.

12. The apparatus of claim 11, wherein, in a second mode, the piston oscillation has a rate differential between piston movement in the first direction versus piston movement in the second direction to cause more of the fluid to move in the second direction than in the first direction.

13. The apparatus of claim 11, wherein at least one lumen of the first plurality of lumens has a circular shape in cross-section.

14. The apparatus of claim 11, further comprising an actuator drive coupled to move the piston relative to the housing, wherein the actuator drive includes a micro-solenoid.

15. The apparatus of claim 11, wherein the piston is comprised of co-axial cylinders intersected by radial spreaders defining a plurality of curved slits.

16. The apparatus of claim 11, wherein the piston includes fish-scale micro-geometry.

17. The apparatus of claim 11, further comprising an actuator drive coupled to move the piston relative to the housing, wherein the actuator drive includes at least one selected from the set consisting of a solenoid, a piezo-transducer, a motor, and a force/displacement converter.

18. The apparatus of claim 17, further comprising a flow rate sensor operatively coupled to the actuator drive and configured to sense a flow rate, wherein the actuator drive is configured to adjust the piston oscillation based on the sensed flow rate.

19. The apparatus of claim 17, further comprising a differential pressure sensor operatively coupled to the actuator drive and configured to sense a differential pressure, wherein the actuator drive is configured to adjust the piston oscillation based on the sensed differential pressure.

20. The apparatus of claim 17, wherein, in a third mode of the actuator drive, the piston oscillation includes using a motion configured to windmill the fluid.

21. An apparatus comprising:
a pump housing defining an elongate interior that extends along a length of the pump housing; and
a unitary piston located in the elongate interior of the pump housing, wherein the piston is the only moving part, and wherein the piston moves relative to the pump housing in an oscillatory pumping motion, and wherein, in a first mode, each cycle of the oscillatory pumping motion has a rate differential between movement in a first direction versus movement in a second direction opposite the first direction to cause more fluid to move in the first direction than in the second direction.

* * * * *